(12) United States Patent
Süss-Wolf et al.

(10) Patent No.: US 8,241,710 B2
(45) Date of Patent: Aug. 14, 2012

(54) METHOD AND APPARATUS FOR SPRAYING ON A TRACK, IN PARTICULAR A CONDUCTOR TRACK, AND ELECTRICAL COMPONENT WITH A CONDUCTOR TRACK

(75) Inventors: Robert Süss-Wolf, Nürnberg (DE); Marco De Paolis, Fürth (DE); Dieter Geist, Forchheim (DE); Gerhard Reichinger, Rednitzhembach (DE); Gerard Pieper, Lübbenau (DE)

(73) Assignee: Leoni AG, Nuremberg (DE)

( * ) Notice: Subject to any disclaimer, the term of this patent is extended or adjusted under 35 U.S.C. 154(b) by 471 days.

(21) Appl. No.: 12/489,925

(22) Filed: Jun. 23, 2009

(65) Prior Publication Data

US 2009/0314520 A1    Dec. 24, 2009

Related U.S. Application Data

(63) Continuation of application No. PCT/EP2007/011339, filed on Dec. 21, 2007.

(30) Foreign Application Priority Data

Dec. 23, 2006   (DE) .......................... 10 2006 061 435

(51) Int. Cl.
   *C23C 4/12*   (2006.01)
   *B05D 1/10*   (2006.01)
   *B05D 1/12*   (2006.01)
(52) U.S. Cl. ...................................... 427/448; 427/446
(58) Field of Classification Search .................. 427/448
   See application file for complete search history.

(56) References Cited

U.S. PATENT DOCUMENTS

| | | | | |
|---|---|---|---|---|
| 3,198,932 A | * | 8/1965 | Weatherly | 219/146.21 |
| 3,280,295 A | * | 10/1966 | Mondain-Monval et al. | 219/76.16 |
| 3,988,566 A | * | 10/1976 | Vogts et al. | 219/121.47 |
| 4,853,515 A | * | 8/1989 | Willen et al. | 219/121.47 |
| 5,766,693 A | * | 6/1998 | Rao | 427/454 |
| 7,045,738 B1 | * | 5/2006 | Kovacevic et al. | 219/121.63 |
| 2004/0055153 A1 | | 3/2004 | Zahradnik et al. | |
| 2006/0258055 A1 | | 11/2006 | Okamoto | |
| 2006/0289404 A1 | * | 12/2006 | Hawley et al. | 219/121.47 |
| 2006/0298404 | | 12/2006 | Hawley et al. | |
| 2008/0202288 A1 | * | 8/2008 | McKechnie et al. | 75/346 |

FOREIGN PATENT DOCUMENTS

| | | | |
|---|---|---|---|
| DE | 4030541 | * | 4/1992 |
| DE | 19807086 A1 | | 8/1999 |
| DE | 103 20 379 A1 | | 12/2004 |
| EP | 1 363 811 B1 | | 11/2003 |
| WO | 2005/031026 A1 | | 4/2005 |
| WO | 2006/118813 A1 | | 11/2006 |

OTHER PUBLICATIONS

Machine English translation of WO 2005/031026 (first published in German Apr. 2005), 3 pages.*
International Search Report, dated Sep. 4, 2008.

* cited by examiner

*Primary Examiner* — Katherine A Bareford
(74) *Attorney, Agent, or Firm* — Laurence A. Greenberg; Werner H. Stemer; Ralph E. Locher

(57) ABSTRACT

A method and an apparatus for spraying a track, in particular a conductor track, onto a substrate under mild conditions, includes generating a cold plasma having a plasma temperature of less than 3000 K in a spray lance, introducing a powder into the spray lance with the aid of a carrier gas and leading the powder to a frontal exit opening, where it exits and impinges on the substrate. An electrical component including an electrically conductive conductor track applied to a substrate, is also provided.

17 Claims, 4 Drawing Sheets

METHOD AND APPARATUS FOR SPRAYING ON A TRACK, IN PARTICULAR A CONDUCTOR TRACK, AND ELECTRICAL COMPONENT WITH A CONDUCTOR TRACK

CROSS-REFERENCED TO RELATED APPLICATIONS

This is a continuation, under 35 U.S.C. §120, of copending International Application No. PCT/EP2007/011339, filed Dec. 21, 2007, which designated the United States; this application also claims the priority, under 35 U.S.C. §119, of German Patent Application DE 10 2006 061 435.6, filed Dec. 23, 2006; the prior applications are herewith incorporated by reference in their entirety.

BACKGROUND OF THE INVENTION

Field of the Invention

The invention relates to a method and an apparatus for spraying a track, in particular a conductor track, onto a substrate. The invention furthermore relates to an electrical component including an electrically conductive conductor track.

The use of a wide variety of spraying methods is known for producing tracks, especially conductor tracks, in particular on an insulating substrate. Thus, European Patent EP 1 363 811 B1, corresponding to U.S. Patent Application Publication No. US 2004/0055153 A1, for example, describes a method for spraying a conductor track onto a substrate with the aid of flame spraying and/or cold gas spraying. In addition, plasma spraying, for example, is also used as a spraying method. German Published, Non-Prosecuted Patent Application DE 103 20 379 A1 discloses applying a heating conductor track in particular through the use of flame spraying for a wide variety of applications.

It has been shown, however, that the known spraying methods are in part complicated and therefore no longer economical, for a cost-effective, flexible use for producing in particular electrical components including the sprayed on conductor track.

In printed circuit board technology, various spraying methods are regularly used, but usually with the use of a spraying mask, wherein the spraying mask exhibits the conductor track pattern to be applied. That method is only appropriate for high numbers. In particular, flexible conductor track courses are not possible in the case of the methods with mask support.

It has also been shown that the connection between the sprayed-on particles and the substrate is in some instances defective or at least subjected to severe fluctuations depending on the material pairings chosen. The quality of the track that is sprayed on is also greatly dependent on the material of the substrate.

During the spraying methods, the particles to be applied are heated and/or highly accelerated. Due to the relatively high thermal and/or kinetic energy of the particles, in some instances an undesirable piercing of the substrate, at least damage to the substrate, is brought about in particular in the case of very thin substrates in the range smaller than 1 mm.

In order to ensure a secure and permanent connection of the substrate to the particles sprayed on, a pretreatment of the substrate is furthermore often required. In some instances it is also provided that a seed layer is applied before the actual track is applied.

SUMMARY OF THE INVENTION

It is accordingly an object of the invention to provide a method and an apparatus for spraying on a track, in particular a conductor track, and an electrical component with a conductor track, which overcome the hereinafore-mentioned disadvantages of the heretofore-known methods, apparatuses and components of this general type, which enable the spraying of a track, in particular a conductor track, on a substrate wherein the quality of the track sprayed on is, as far as possible, independent of the substrate material used and in which the course of the conductor track can be chosen freely.

With the foregoing and other objects in view there is provided, in accordance with the invention, a method for spraying a track, in particular a conductor track, onto a substrate. The method comprises providing a spray lance extending in a longitudinal direction and having devices including a cathode, walls, a frontal exit opening and a feed connector for powder oriented at an angle obliquely relative to the longitudinal direction. The spray lance is moved at a relative speed relative to the substrate. An ionizable gas is fed to the spray lance under atmospheric conditions. The gas is ionized by an arc generated in the spray lance to generate a cold plasma having a plasma temperature of less than 3000 K, in particular less than 2500 K. A powder is introduced into the spray lance with the aid of a carrier gas. The powder is carried along by the plasma in direction of the frontal exit opening of the spray lance to exit through the frontal exit opening and impinge on the substrate. A flow of the ionizable gas and the carrier gas is fed into the spray lance approximately under the same pressure, in a range of approximately $1*10^5$-$10*10^5$ Pa. The angle of orientation of the feed connector, the flow of the ionizable gas and the flow of the carrier gas are coordinated with one another to cause the powder to pass from the feed connector along an arcuate path to the exit opening without coming into contact with the devices or walls of the spray lance. The feed connector is spaced at a distance of approximately 1 cm from the exit opening in the longitudinal direction and at a distance in a range of 5 to 7 cm from the cathode of the spray lance in the longitudinal direction.

Accordingly, in particular a conductor track is applied to a substrate with the aid of a spray lance extending in the longitudinal direction. In this case, the spray lance is moved at a relative speed relative to the substrate in order to thus be able to freely choose the course of the conductor track in a mask-free manner and without limitations. In this case, the spraying method is based on atmospheric cold plasma spraying wherein an ionizable gas is fed to the spray lance, the ionizable gas being ionized by an arc generated in the spray lance. In this case, a cold plasma having a plasma temperature of preferably less than 2500 K arises. At the same time, a powder is introduced into the spray lance with the aid of a carrier gas flow, which powder is carried along by the plasma in the direction of a frontal exit opening of the spray lance, exits there and subsequently impinges on the substrate and forms the conductor track there.

As a result of using a cold plasma having a plasma temperature of less than 3000 K, preferably less than 2500 K, and in particular less than 2000 K, firstly the technological complexity for the spraying method is very low and only associated with low costs with respect to capital expenditure. At the same time, the cold plasma inputs a comparatively low amount of energy into the material to be applied, such that the material is applied to the substrate under very mild conditions. Even thin substrate layers smaller than 1 mm down to a few μm are therefore not destroyed during the spraying method. As a result, this method is in particular also suitable for spraying tracks, in particular conductor tracks, on extreme thin-film substrates or generally on sensitive, for example temperature-sensitive, substrates. With regard to the simplest possible configuration, it is of particular importance that the method be performed under atmospheric conditions. No encapsulation and no vacuum or the like is therefore necessary. Moreover, the use of a protective gas is preferably dispensed with. Rather, the plasma being generated comes into contact with the surrounding atmosphere.

It has been shown that with a method of this type, the tracks can be applied on a wide variety of materials with comparably good quality. By way of example, plastics, such as PE, ABS, filled or unfilled polymers, and mica, cardboard, paper, porcelain, ceramics, such as SIC and glass, are suitable as substrate material. Furthermore, textile materials such as fabrics, textile substances, or alternatively foams, are also suitable. It is also possible to spray over different, mutually adjacent carrier materials without any problems.

Metal powders, in particular, are used as the powder. In addition, however, powders in which the particles are composed of plastic, glass or alternatively of salts are also suitable. If conductor tracks are intended to be produced, preferably tin or a tin alloy and alternatively copper or a copper alloy is used as the powder. Tin or a tin alloy is suitable for this method in particular in the case of thin-film substrates since, due to the low softening temperature of tin, a very low energy input is required and the tin particles can therefore be applied under very mild conditions for materials. Besides the nonmetallic substrates, it is also possible, in principle, to use metallic substrates for example for coating purposes. In principle, any desired (metallic) powders can be used and there is the possibility of connecting together two partial tracks composed of different materials, for example a suitable material pair in accordance with the thermoelectric series for forming thermoelements or thermogenerators with use of the thermoelectric effect.

It is particularly advantageous that this method leads to good quality tracks, in particular conductor tracks, without a pretreatment of the substrate being necessary or therefore being provided either. The high flexibility as a result of the mask-free application also makes this method particularly economical. What is crucial in this respect is that adaptation of the process parameters is not necessary for different substrate materials. This means that, depending on the specific apparatus construction of the spraying apparatus independently of the choice of substrate material, only one parameter set needs to be set and that parameter set can be used to treat a wide variety of substrate materials.

In accordance with another feature of the invention, preferably, the spray lance includes a lance head, which is embodied in the manner of a simple nozzle and which tapers conically and in particular is embodied such that it runs in pointed fashion toward the exit opening. Therefore, special nozzles that accelerate the gas to high, in particular supersonic, speeds are deliberately not used. Rather, the gas speed remains below the speed of sound, with the result that a concentrated, directed jet having low kinetic energy and a low degree of jet widening emerges. Therefore, the exit opening also has a diameter lying in the range of the intended track width.

Since the powder is additionally added within the spray lance, a very controlled method is made possible. In particular, through the choice of the size of the exit opening, a delimited, sufficiently thin spraying jet can be established, with the result that no masks or the like are necessary or provided for producing tracks having sharp boundaries. Rather, preferably track widths in the range of less than 1 mm up to tens of mm, for example, are set with high track width accuracy. Preferably, track widths in the range of between 0.2 mm and 10 mm are set, to be precise preferably exclusively by the choice of the dimension (diameter) of the exit opening.

In particular, for track widths of less than 1 mm, for example, drawn glass nozzles (lance heads) are preferably used. It is possible to set very small openings with high accuracy, in a manner similar to that of pipettes, etc. through the use of drawing.

In order to produce the track, the spray lance is expediently spaced apart from the substrate at a spraying distance in the range of between 1 mm or 3 mm to 35 mm. This short spraying distance in conjunction with the atmospheric cold plasma permits the production of high-quality tracks composed of a wide variety of materials on a wide variety of carrier substrates. By virtue of the direct proximity of the plasma to the carrier substrate, the latter experiences as it were a surface activation, with the result that the individual powder particles adhere well. The thermal loading is very low due to the comparatively low plasma temperature. Furthermore, the small spraying distance also has a positive effect on small track widths with a sharp and uniform boundary.

In order to ensure an economical application, it is important that the method can be reliably integrated in a continuous process. It is only this which makes it possible to use the method, for example in the context of a production line on a conveyor belt. Operation for a number of hours and preferably also for a number of days, without maintenance work and interruptions, must therefore be made possible with the method and the corresponding apparatus for carrying out the method. However, due to the direct introduction of the powder into the spray lance and the processes proceeding there for generating the plasma, there is the risk of continuous operation being jeopardized by deposits of the powder fed within the spray lance.

Therefore, in accordance with one preferred development, a feed connector for the powder is provided at an angle obliquely with respect to the longitudinal direction of the spray lance. In this case, the angle, the gas flow, that is to say basically the flow of ionized gas and the carrier gas flow, are coordinated with one another in such a way that the powder passes from the feed connector along an arcuate path to the exit opening without coming into contact with devices or walls of the spray lance. This specific setting of the process parameters, depending on the stated conditions and possibly further conditions, ensures that for example caking in the region of the exit opening that would gradually clog the latter does not occur. These measures also prevent individual particles from depositing, for example on the inner walls of the spray lance or else on a cathode for generating the arc. In this case, the angle preferably lies between 10° or 20° to 70°, in particular in the range of between 20° and 30°. At this angle, particularly little deflection in conjunction with a compact configuration arises, with the result that the powder passes on an approximately direct path to the exit opening.

In order to reliably obtain continuous and disturbance-free operation, the exit opening is at a distance of preferably approximately only a few centimeters, preferably only approximately 1 cm, from the feed connector. A center line of the feed connector is the reference point in this case. At the same time or as an alternative, the feed connector is at a distance in the range of approximately 5-7 cm from the cathode. In this case, this distance is set depending on the material used for the powder. The lower the melting point of the material, the smaller the distance from the cathode. This distance is therefore in the lower range with the use of tin, whereas the distance lies in the upper range with the use of copper, which has a higher melting point in comparison with tin.

Preferably, a plurality of feed connectors are disposed in a manner distributed around the circumference of the spray lance. This serves, inter alia, for producing a jet which is axially parallel, as far as possible. In particular, 3 to 6 feed connectors are disposed in a manner distributed uniformly around the circumference.

Furthermore, for continuous operation in accordance with one expedient development, it is provided that the ionizable gas and the carrier gas flow into the spray lance approximately under the same pressure. Therefore, conditions which are as uniform as possible prevail within the spray lance and excessive turbulences do not occur. Such turbulences would disadvantageously have the effect that the powder fed in could not pass to the exit opening in a targeted manner. In this case, the pressure preferably lies in the range of between 0.5 or 1 and 10 bar ($1*10^5$-$10*10^5$ Pa). In particular, it lies in the region of $2*10^5$ Pa.

It is furthermore expediently provided that both the ionizable gas and the carrier gas originate from an identical gas source. A total gas volumetric flow is therefore divided into a volumetric flow for the ionizable gas and into a volumetric flow for the carrier gas. As a result of this, the two volumetric flows have approximately the same pressure level. Therefore, there is no need for complicated pressure regulation for the two gas flows. Expediently, in this case the proportion made up by the carrier gas in the total gas volumetric flow is approximately 5-15%, and in particular approximately 8%. The volumetric flow of carrier gas preferably lies between 10 and 25 l/min, and in particular in the range of between 15-19 l/min. The speed of the gas flows is preferably less than 200 m/s, with the result that the installation operates with low noise and no sound-proofing measures are required.

Before the carrier gas with the powder is fed to the spray lance, the carrier gas is conducted through a metering apparatus in order to take up the powder. In this case, in one expedient configuration, the metering apparatus includes a powder storage container and a metering chamber, into which the powder from the powder storage container is metered with the use of gravitational force through a metering tube onto a preferably rotating metering plate. The powder is taken up from the metering plate through the use of a suction lance. In order to achieve this, the carrier gas is introduced through an inlet into the metering chamber, with the result that approximately the pressure of the carrier gas flow prevails within the metering chamber. The carrier gas leaves the metering chamber again through the suction lance. During the inflowing into the opening of the suction lance, the powder situated in direct proximity to this opening is entrained and then concomitantly carried by the carrier gas flow.

In order to ensure that powder is conducted as uniformly and continuously onto the metering plate as possible, the powder storage container is expediently exposed to pressure, in particular to the pressure of the carrier gas. As a result of this, the powder is forced in the direction of the metering tube in a structurally simple manner, with the result that no voids form in front of the metering tube. In addition or as an alternative to this, the powder is subjected to vibrations at least in the region of its entry into the metering tube. For this purpose, the powder storage container is embodied with a suitable vibrator. By way of example, the container vibrates in its lower region or a vibration element penetrates directly into the powder storage device.

The metering plate preferably has a circumferential groove into which the metering tube and the suction lance descend, preferably at approximately opposite positions. In this case, the width of the groove is only slightly larger, for example larger by a small tolerance or gap dimension of a few tenths of a millimeter, than the external diameter, in particular of the suction lance. Overall, a high inflow speed is thereby achieved in the region of the opening of the suction lance which lies in the groove, with the result that the powder is reliably entrained.

The metering in this case is expediently set in such a way that a powder application rate in the range of 1-20 g/min and in particular of approximately 5 g/min is set. Given a powder application rate of 5 g/min with the use of tin, in particular, the volumetric flow of the carrier gas in this case is set to approximately 17 l/min.

For continuous, interruption-free operation, for example in a production installation that is in operation 24 hours a day (3 shift operation), the powder is fed to the storage container fully automatically through a feed line. For this purpose, the powder is blown into the container through the feed line. Therefore, the supply container is not a sealed container that has to be manually exchanged or manually filled.

In accordance with one expedient development, a plurality of supply containers filled with different powders are provided. The different powders, that is to say in particular different powder materials, are fed to the spray lance in a defined mixing ratio. This measure makes it possible to produce conductor tracks in a desired material composition with a precisely defined property profile without any problems.

It is furthermore provided that the spray lance is moved at a relative speed in the range of 10 cm/min-90 cm/min with respect to the substrate. In principle, it is also possible in this case for the substrate to be moved and the spray lance to be held stationary.

Interruptions of the conductor track can be achieved just by increasing the relative speed. This affords the advantageous possibility of producing different electrical conductor tracks, which are not in electrical contact with one another, in a continuous spraying method without having to adjust spraying operation. In order to form the interruption, the relative speed is momentarily increased to a value, in particular, of greater than 100 cm per minute.

The conductive track applied expediently serves as a heating conductor track, which is applied in particular in meandering fashion. The heating conductor track is preferably provided for heating a mirror, in particular a motor vehicle mirror.

In addition, in principle, a multiplicity of further application possibilities are provided for using the electrically conductive track for heating purposes or for heating specific components.

In general, the conductor track is used for electrical components that make use of electrical conductivity. In particular, the conductor track with its direct application to a component, for example to a motor vehicle component, in this case serves for carrying current in the context of an on-board electrical system. Due to its conductivity, however, the conductor track can also be embodied as a shield, as an electrical contact, as an antenna, etc. In this case, the embodiment of the antenna is provided in particular in the context of a so-called RFID application (Radio Frequency Identification). The embodiment of conductor track segments of different widths also makes it possible to form security elements, etc.

In addition, with this method there is also the possibility, in principle, of performing coatings, etc.

This method is expediently used to apply the track produced continuously to mutually adjacent substrates of different materials. This advantageously makes use of the fact that the adhesion is virtually material-independent. Material transitions can therefore be sprayed over without any problems. This is particularly advantageous in the case of hybrid components, in particular in which different materials are connected to one another.

The method is in particular also suitable for the through-plating of printed circuit boards, for example in power electronics. For this purpose, a through hole in the printed circuit board for power electronics is provided with the electrically conductive coating. In this case, it can be provided that the relative speed is equal to zero.

With the objects of the invention in view, there is also provided an apparatus for spraying a track, in particular a conductor track, onto a substrate. The apparatus comprises a spray lance extended in a longitudinal direction and movable at a relative speed relative to the substrate. The spray lance has devices including a cathode, walls, a frontal exit opening and a feed connector oriented at an angle obliquely relative to the longitudinal direction. The spray lance is configured for receiving an ionizable gas and ionizing the gas by an arc generated in the spray lance to generate a cold plasma having a plasma temperature of less than 3000 K, in particular less than 2500 K. The feed connector is configured for receiving a powder with the aid of a carrier gas. The powder is carried along by the plasma during operation in direction of the frontal exit opening, exits there and impinges on the substrate. The feed connector is configured for feeding a flow of the ionizable gas and the carrier gas into the spray lance during operation approximately under equal pressure in a range of approximately 1*105-10*105 Pa. The angle of the feed connector, the flow of the ionizable gas and the flow of the carrier gas are coordinated with one another to cause the powder to pass from the feed connector along an arcuate path to the exit opening without coming into contact with the devices or the walls of the spray lance. The feed connector is spaced at a distance of approximately 1 cm from the exit opening in the longitudinal direction and at a distance in a range of 5 to 7 cm from the cathode of the spray lance in the longitudinal direction.

Expediently, the spray lance is embodied in two parts and includes a plasma tube, to which a lance head is attached in exchangeable fashion. The lance head has a feed connector and the exit opening. By virtue of the exchangeability, different tracks, which differ for example with regard to their track width, can be produced through the use of differently embodied lance heads. Moreover, there is the possibility of adapting the lance heads to different types of powder through the use of differently embodied lance heads, in which for example the position and orientation of the feed connector differ. Expediently, in this case the differently embodied lance heads are automatically exchangeable in a simple manner by virtue of their being kept in a changer unit, for example a turret head.

With the objects of the invention in view, there is concomitantly provided an electrical component, comprising a substrate and an electrically conductive conductor track having been applied to the substrate by the method according to the invention. The electrical component is a heatable mirror, in particular.

Other features which are considered as characteristic for the invention are set forth in the appended claims, noting that the advantages and preferred configurations presented with regard to the method can analogously also be applied to the apparatus, the metering apparatus, and/or the electrical component.

Although the invention is illustrated and described herein as embodied in a method and an apparatus for spraying on a track, in particular a conductor track, and an electrical component with a conductor track, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, which are diagrammatic and in part greatly simplified illustrations.

DETAILED DESCRIPTION OF THE INVENTION

Figure 1:
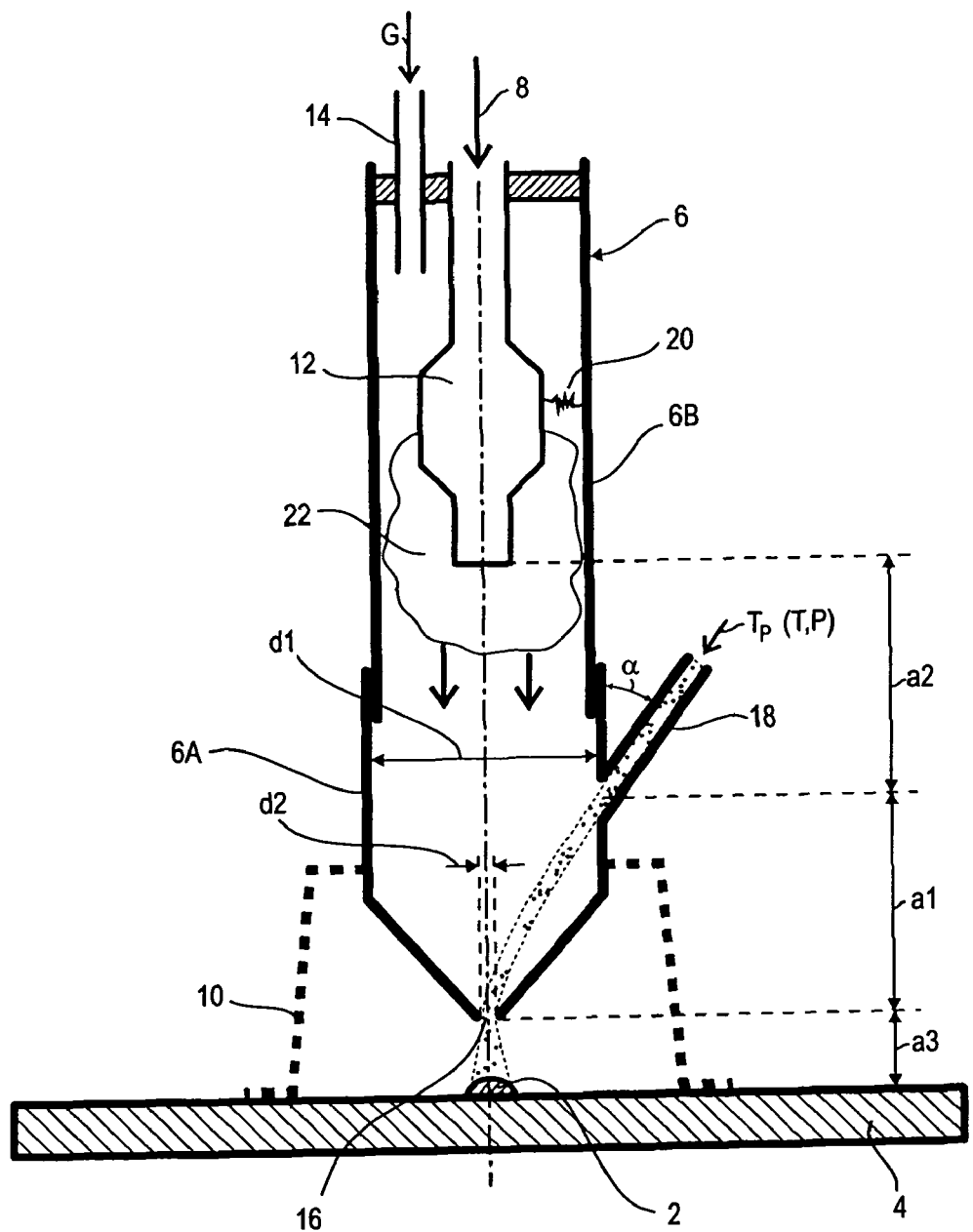
FIG. 1 is a diagrammatic, cross-sectional view of a spray lance with which the spraying method will be explained.

Referring now in detail to the figures of the drawings, in which identically acting parts are provided with the same reference symbols, and first, particularly, to FIG. 1 thereof, there is seen a spray lance 6 which is used for applying a track, in particular a conductor track 2, to a substrate 4, in particular composed of an insulation material. The spray lance 6 is moved relative to the substrate in order to produce the conductor track 2. In this case, the spray lance 6 is attached in particular to an adjusting device having an adjustment possibility along three axes, that is to say within an X-Y plane defined by the substrate 4 and also within a Z direction defined by a longitudinal direction 8 of the spray lance. In this case, the adjusting device is, for example, a multi-axis device formed with linear drives. As an alternative thereto, the adjusting device is a multi-axis, in particular six-axis, industrial robot. In this case, the spray lance 6 is attached to a robot hand of the industrial robot.

The spray lance 6 is moved over the substrate 4 in order to produce a conductor track pattern defined by the movement of the spray lance 6. No masking aid whatsoever is used in this case. The conductor track pattern is solely defined by the relative movement of the substrate 4 with respect to the spray lance 6. No pretreatment of the substrate 4 whatsoever is provided either. Rather, the conductor track 2 is applied directly to the surface of the substrate 4.

A suction cup 10, which is illustrated in dotted fashion in FIG. 1, can be attached as required to the spray lance 6. A suction connection (which is not illustrated in any more specific detail in this case) is disposed on the suction cup and is used to set a reduced pressure in the suction cup 10. This affords the possibility of sucking away excess material and passing it on for recycling, if appropriate. The use of such a suction cup is known, for example, in the case of a coating method revealed in International Publication No. WO 02/058887 A1, corresponding to U.S. Pat. No. 6,997,780. The conductor track 2 is preferably applied without a suction cup 10. This affords advantages in particular in the case of three-dimensionally contoured substrates 4, since sealing for generating reduced pressure in the suction cup 10 is not possible, or is only possible with very great difficulty, in those cases. Instead, without a suction cup 10, the spray lance 6 can be guided freely and as desired even over complex surface structures of the substrate 4.

The spray lance 6 itself is an approximately tubular structure extending in the longitudinal direction 8 and having devices and walls. The spray lance 6 is subdivided into two module parts, namely a lower lance head 6A and an upper plasma tube 6B. These two components are releasably attached to one another. The plasma is generated within the plasma tube 6 during operation. Powder is fed into the spray lance 6 in the lance head 6A. In particular, the lance head 6A is screwed on or else attached to the plasma tube 6B by a type of quick connection, such as a bayonet connection, for example. This releasable attachment enables the lance head 6A to be exchanged and replaced by another lance head without any problems. In particular, this measure makes it possible to carry out a simple "tool change" in order for example to produce conductor tracks 2 having different conductor track widths.

A device 12, in the form of a cathode, and a feeder 14 for an ionizable gas, in particular nitrogen N, are respectively provided in and on the plasma tube 6B. The spray lance 6 is closed off by an insulating cover a its top side. The spray lance 6 has an exit opening 16 at the other, opposite, frontal end. A feed connector 18 is disposed laterally in a lower region below the cathode 12 and as part of the lance head 6A. The spray lance 6, at least in the lower region below the cathode, has an internal diameter d1 in the range of approximately 1 cm and, for example, may be 8 mm. In this exemplary embodiment, a diameter d2 of the exit opening 16 lies in the range of a few millimeters, for example 3 mm. Generally, the internal diameter d1 is approximately two to five times the diameter d2 of the exit opening 16. In principle, the exit opening can vary over a wide range for example of 0.2 mm up to 10 mm or even more than that. A correspondingly larger internal diameter d1 is chosen in the case of the larger diameters.

The feed connector 18 is spaced apart from the exit opening 16 by a distance a1 with respect to the exit opening 16. At the same time, the feed connector 18 is spaced apart from the cathode 12 by a distance a2. The distance is measured herein proceeding from the center of the entry opening of the feed connector 18 in each case. The distance a1 is approximately 1 cm, particularly when tin is used as a spray material. By contrast, the distance a2 lies in a range of 5-7 cm, with a distance of approximately 5 cm being set in the case of tin. The different distance a1, a2, is set by the choice of differently embodied lance heads 6A. Therefore, different lance heads 6A are preferably used depending on different spray materials.

The exit opening 16 is in turn spaced apart from the surface of a substrate 4 by a spraying distance a3. This distance lies in the range of between 1 and 35 mm. By virtue of this comparatively very short spraying distance a3, discrete, sharply delimited conductor tracks 2 can be produced without any problems.

During operation, a voltage, in particular an AC voltage, is applied to the cathode 12. In the exemplary embodiment, an AC voltage having a frequency of several kHz, in particular of 14 kHz, is applied in this case. This high voltage gives rise to a non-stationary arc 20 between the cathode and the cylindrical wall, acting as an anode, of the spray lance 6. In the exemplary embodiment, the electrical power with which the spray lance 6 is operated preferably lies in the range of a few 100 watts, for example in the range of 300 and 500 W.

At the same time, the ionizable gas G, nitrogen in the exemplary embodiment, is fed from above through the feeder 14 under a pressure in the range of a few bar, preferably of 2 bar. The gas G is ionized due to the arc 20 and forms a plasma 22. The latter is represented schematically by a plasma cloud in FIG. 1. The plasma 22 propagates in the direction of the exit opening 16, as illustrated by arrows. Due to the electrical power being introduced, which is only low, a cold plasma having temperatures of significantly less than 3000 K is involved in this case.

Furthermore, a particle flow $T_P$ is introduced through the feed connector 18 into the interior of the spray lance 6 in the region of the lance head 6A. The particle flow $T_P$ is formed by a volumetric flow of a carrier gas T, likewise nitrogen in the exemplary embodiment, and individual particles of a powder P used as a spray material. In the exemplary embodiment, the powder P being used is a tin powder having a particle size in the range, for example, of 1 μm to 100 μm particle diameter. The volumetric flow of the carrier gas T is set for example to 17 liters per minute. At the same time, the particle flow of the powder P is set to 5 grams per minute. The carrier gas T is likewise fed in under a pressure of a few bar, preferably under the same pressure as the gas G, that is to say of 2 bar in the exemplary embodiment. In this case, the particle flow $T_P$ enters into the spray lance 6 at an angle α with respect to the center rotation axis of the spray lance 6 and thus with respect to the longitudinal direction 8. In this case, the angle α corresponds to the angle at which the feed connector 18 is inclined relative to the longitudinal direction 8. The angle α lies in a range of between 20 and 30°.

What is achieved through the use of the process parameters chosen in the exemplary embodiment in conjunction with the angle α is that the particle flow $T_P$ passes to the exit opening 16 in an arcuate manner without individual particles of the powder P coming into contact with the cathode 12 or a wall region at the exit opening 16. Therefore, no deposits that disturb continuous operation, etc. are formed. Overall, the process parameters described herein have been found to be particularly advantageous with the use of tin as the powder P. In particular, the dynamic process parameters, the volumetric flows of the gas G, of the carrier gas T and the mass flow rate of the powder P have proved to be particularly advantageous for achieving stable continuous operation. The feeding of the particle flow $T_P$ is particularly critical for ensuring continuous operation.

Figure 2:
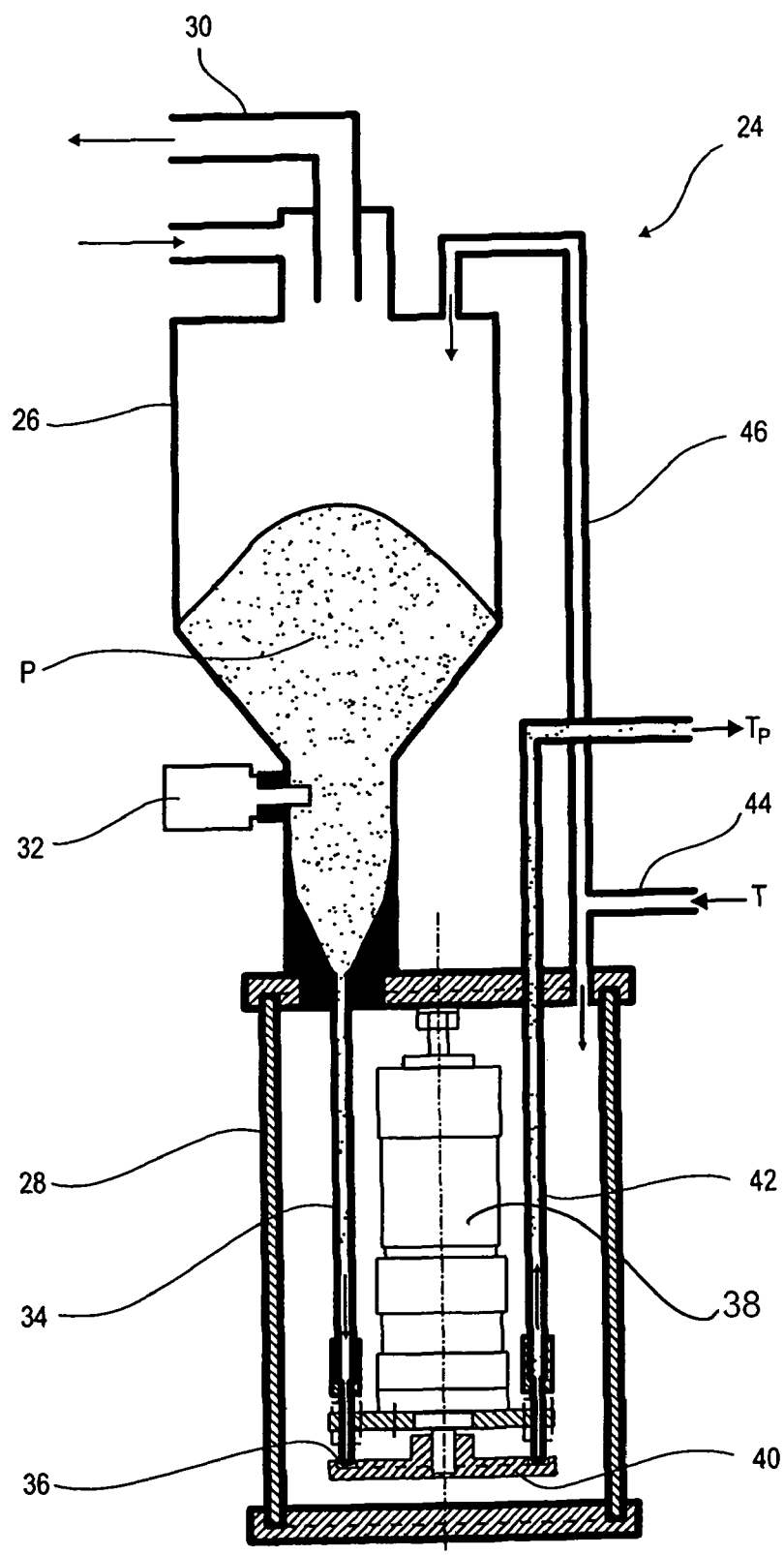
FIG. 2 is a cross-sectional view of a metering apparatus.
Figure 3:
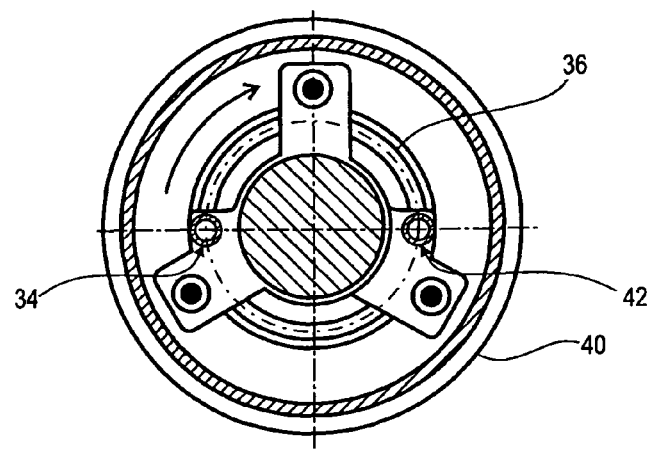
FIG. 3 is a plan view of a metering plate.

Therefore, in particular the metering in of the particle flow $T_P$ is also of crucial importance for continuous operation that is required. The provision of the particle flow will now be explained in greater detail in conjunction with FIGS. 2 and 3. In this case, FIG. 2 shows a diagrammatic, cross-sectional illustration of a metering apparatus 24. The latter includes a powder storage container 26, which is placed onto a meter chamber 28. The powder P is stored in the powder storage container 26. A quantity of powder P that is sufficient at any time can automatically be provided through supply lines 30 in conjunction with a filling level sensor 32. A lower end of the powder storage container 26 is embodied in funnel-shaped fashion and leads into a metering tube 34, which penetrates into the metering chamber 28. The metering tube 34 ends with its mouth opening into an annular groove 36 of a metering plate 40, which can be rotated through the use of an electric motor 38. The rotational speed of the metering plate 40 can be varied depending on the desired application rate and is, for example, 5 to 45 revolutions per minute, given a diameter of the annular groove 36 of approximately 25 mm. A suction lance 42, which is opposite the metering tube 34, descends with its entry opening into the annular groove 36. The spray lance 42 and the metering tube 34 have the same internal diameter of a few mm, for example of approximately 2 mm. In a manner corresponding thereto, the annular groove 36 has a width lying somewhat above the external diameter of the suction lance 42 or of the metering tube 34. The annular groove 36 therefore has a width of approximately 2 mm in the exemplary embodiment. At the same time, the annular groove 36 has a depth of a few millimeters, for example of approximately 1 mm.

During operation, the carrier gas is conducted into the meter chamber 28 through a feed line 44. At the same time, the powder storage container 26 is also exposed to the pressure of the carrier gas T through a branch line 46. The supply lines 30 are usually blocked through the use of valves (which are not illustrated in more specific detail herein), in such a way that the carrier gas T does not escape through these lines. Through the use of this measure, the powder storage container 26 is pressurized, with the result that the powder P is forced in the direction of the funnel. In addition, a non-illustrated vibration element is provided, which ensures that the powder P is then guided uniformly through the metering tube 34. The powder P passes through the metering tube 34 into the annular groove 36. As a result of the rotation of the metering plate 40, the annular groove 36 is at least partly filled with powder continuously through the metering tube 34.

The carrier gas T leaves the metering chamber 28 again through the suction lance 42. For this purpose, the carrier gas T flows into the suction lance 42 through the opening thereof which is disposed in the annular groove 36. In this case, the powder P situated in the annular groove 36 is entrained and completely sucked in as well, with the result that the particle flow $T_P$ escapes from the metering device 24 through the suction lance 42 and is fed to the feed connector 18 of the spray lance 6.

The overall method is described again with reference to FIG. 4.

A total gas flow $G_G$ is provided from a central gas supply 48 (for inert gas, in particular nitrogen). The latter is passed through a high-precision pressure control unit 50 and throttled to the desired operating pressure of 2 bar in the exemplary embodiment. The total gas flow $G_G$ is divided downstream of the pressure control unit 50 into the gas flow G and the carrier gas flow T. The gas flow G is conducted to the feeder 14 of the spray lance 6. The carrier gas flow T is fed to the metering device 24, where it is once again divided, as described with regard to FIG. 2. In the metering device 34, the carrier gas T mixes with the powder P and is fed as a particle flow $T_P$ to the feed connector 18. Apart from the pressure provided by the central gas supply 48, no further conveying devices are provided. The entire process is in particular automatically controlled and regulated with the aid of a control device 52. The latter therefore controls and regulates the individual components such as the spray lance 6, the metering device 24, the pressure control unit 50 and a powder supply unit 54 for which, if appropriate, a powder conveying device can be provided. In particular, the control unit 52 also controls the power supply of the spray lance 6 and, for example, also performs the guiding of an industrial robot used to move the spray lance 6. In this case, the control unit 52 can be divided among a plurality of individual components.

Figure 4:
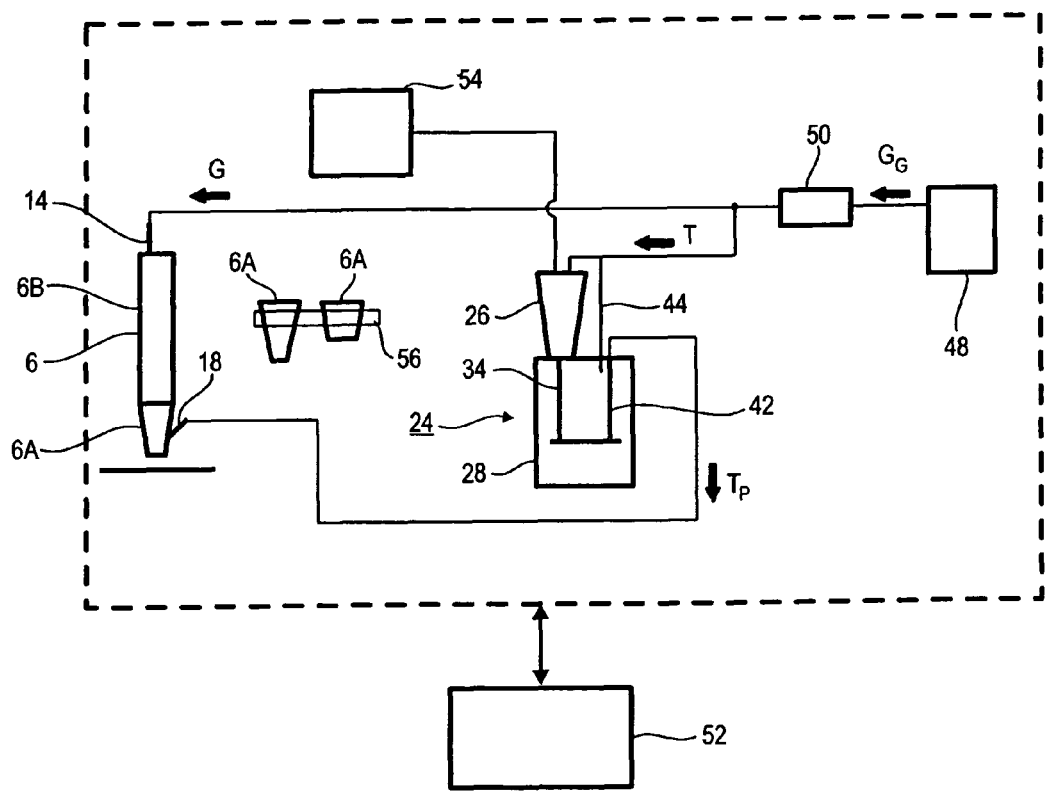
FIG. 4 is a schematic illustration with which the overall process will be explained.

FIG. 4 furthermore illustrates by way of example a changer unit 56, which provides parking positions for a plurality of different lance heads 6A. The changer unit is for example a (rotary) magazine (turret head) disposed in particular directly on the adjusting device (robot hand). A fast and automatic change of the lance head 6A is thereby made possible. Consequently, with just one adjusting device it is possible to produce a wide variety of conductor tracks 2.

Figure 5A:
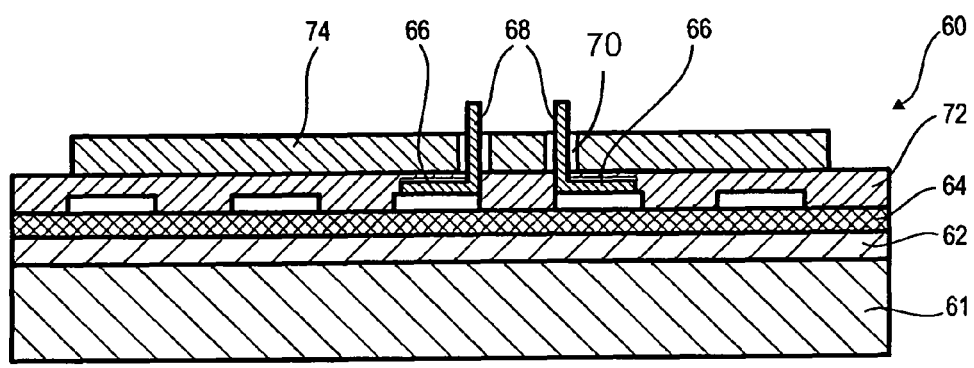
FIGS. 5A and 5B are respective sectional and plan views of a heatable mirror.
Figure 5B:
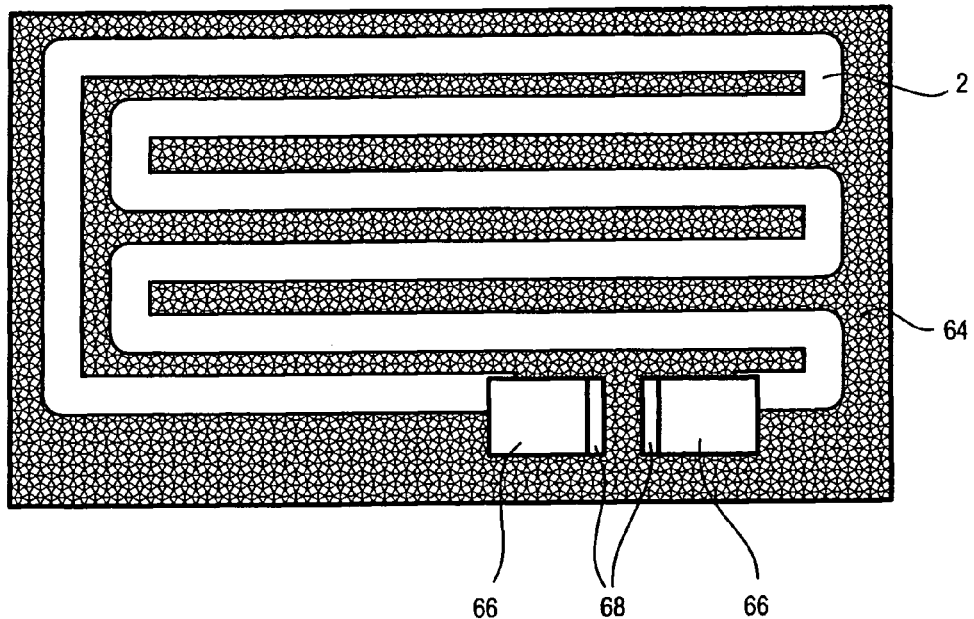

An application for applying a conductor track 2 to an electrical component on the basis of the example of a heatable mirror 60 will now be illustrated with reference to FIGS. 5A and 5B. As can be gathered from FIG. 5A, the mirror 60 includes a glass layer 61, to which a reflection layer 62 composed of chromium is applied. A base layer 64, in particular including a covering lacquer, is in turn adjacent the latter. The conductor track 2 is formed on the base layer 64 in meandering fashion. Its ends are provided with electrical contacts 66. The latter serve for the connection of lines 68, for example through plugs 70. A fragmentation protective layer 72 is fitted over the meandering conductor track 2 and a carrier plate 74 is in turn disposed on that layer. The reflection layer 62 has a thickness of a few μm. The base layer 64 also has a thickness in the μm range and is smaller than 1 mm.

The method described herein can be used to apply the conductor track 2 as a heating track without the base layer 64 being excessively stressed and in particular damaged. This measure therefore enables the conductor track 2 embodied as a heating track to be applied efficiently, rapidly and at the same time operationally reliably.

In addition to this specific field of application for an electrically heatable mirror 60 as described herein, the method described herein can also be used to provide a wide variety of electrical components with a conductor track 2. By way of example, entire cable assemblies can thereby be generated directly on a component by spraying. In principle, the conductor track 2 as a heating conductor can be applied to a wide variety of substrates and for a wide variety of applications. The conductor track 2 can also be used to form electrical functional elements such as, for example antennas, resistors, shields, etc., by suitably setting the properties of the conductor track 2. Finally, this method is also appropriate for forming contacts and contact elements. For example, for through-plating of printed circuit boards in particular in power electronics or alternatively for making contact with piezo-elements.

Overall, the method described herein is distinguished by its very high flexibility, its universal use on a wide variety of materials, its capability of continuous operation and also the mild treatment of the substrate 4 due to only low energy being introduced. With regard to the capability of continuous operation including in 24 h three-shift operation, the following measures can be highlighted, which are preferably used in combination: A continuous powder feed into the storage container or containers (26), an automatic setting of the track width by way of the exit opening of the lance head (6A), in particular in conjunction with the automatic, robot-controlled exchangeability of the lance head and the provision of a plurality of different lance heads (6A) in a changer unit (6). For this purpose, the lance heads (6A) are embodied with a quick change connection that can be actuated in an automated manner. Quick change connections that can be actuated in an automated manner are preferably also provided for the attachment of feed lines to the feed connector (18).

It is furthermore advantageous for integration into a production installation that the gas speeds within the system are comparatively low and are less than 200 m/s, with the result that the noise burden is low. Excess powder can be swept away from the substrate with the aid of commercially available suction units.

A further particular advantage can be seen in the fact that operation is very robust and the spraying parameters such as gas speeds, powder feed rate, etc., once set, can be maintained independently of the substrates, for example.

The invention claimed is:
1. A method for spraying a track onto a substrate, the method comprising the following steps:
providing a spray lance extending in a longitudinal direction and having devices including a cathode, walls, a frontal exit opening and a feed connector for powder oriented at an angle obliquely relative to the longitudinal direction;

moving the spray lance at a relative speed relative to the substrate;

feeding an ionizable gas to the spray lance;

ionizing the gas by an arc generated in the spray lance to generate a cold plasma having a plasma temperature of less than 3000 K;

introducing a powder into the spray lance with the aid of a carrier gas;

carrying the powder along by the plasma in direction of the frontal exit opening of the spray lance to exit through the frontal exit opening and impinge on the substrate;

feeding a flow of the ionizable gas and the carrier gas into the spray lance approximately under the same pressure, in a range of approximately $1*10^5$-$10*10^5$ Pa;

coordinating the angle of orientation of the feed connector, the flow of the ionizable gas and the flow of the carrier gas with one another to cause the powder to pass from the feed connector along an arcuate path to the exit opening without coming into contact with the devices or walls of the spray lance; and spacing the feed connector at a distance of approximately 1 cm from the exit opening in the longitudinal direction and at a distance in a range of 5 to 7 cm from the cathode of the spray lance in the longitudinal direction.

2. The method according to claim 1, wherein the track is a conductor track.

3. The method according to claim 1, wherein the plasma temperature is less than 2500 K.

4. The method according to claim 1, which further comprises providing the spray lance with a lance head having a cylindrical part and a tapered part, providing the cylindrical part with the feed connector, and providing the tapered part as a simple nozzle tapering toward the exit opening in the tapered part to cause the carrier gas with the powder to maximally reach a speed below the speed of sound.

5. The method according to claim 4, which further comprises forming the lance head of glass having a tip with the exit opening being drawn to a defined end dimension.

6. The method according to claim 5, which further comprises attaching the lance head interchangeably, storing a plurality of lance heads in a changer unit and automatically selecting and attaching a lance head in dependence on a desired track width.

7. The method according to claim 1, which further comprises moving the spray lance over the substrate at a spraying distance in a range of between 3 and 35 mm.

8. The method according to claim 1, which further comprises setting the angle of orientation of the feed connector at approximately between 2° and 70°.

9. The method according to claim 1, which further comprises using an identical gas source for the ionizable gas and the carrier gas, and predetermining a common pressure for the gas and the carrier gas by branching a total gas volumetric flow from the gas source into a volumetric flow for the gas fed to the spray lance and a volumetric flow for the carrier gas.

10. The method according to claim 9, which further comprises conducting the branched-off carrier gas through a metering apparatus in order to take up the powder.

11. The method according to claim 10, which further comprises providing the metering apparatus with a powder storage container and a metering chamber, metering the powder from the powder storage container into the metering chamber using gravitational force through a metering tube onto a metering plate and taking up the powder from the metering plate with a suction lance by introducing the carrier gas into the metering chamber and entraining a flow of the powder into the suction lance.

12. The method according to claim 11, which further comprises rotating the metering plate.

13. The method according to claim 11, which further comprises exposing the powder storage container to the pressure of the carrier gas.

14. The method according to claim 11, which further comprises automatically feeding the powder to the powder storage container for continuous operation.

15. The method according to claim 11, which further comprises filling a plurality of powder storage containers with different powders and feeding the different powders to the spray lance in a predetermined mixing ratio.

16. The method according to claim 1, which further comprises moving the spray lance relative to the substrate at a relative speed in a range of 10 cm/min to 90 cm/min.

17. The method according to claim 1, which further comprises preventing depositions of powder in vicinity of the exit opening within the lance head, due to the distances between the feed connector, the exit opening and the cathode.

* * * * *